United States Patent
de Weerdt et al.

(10) Patent No.: US 10,107,882 B2
(45) Date of Patent: Oct. 23, 2018

(54) PARALLEL MRI WITH $B_0$ DISTORTION CORRECTION AND MULTI-ECHO DIXON WATER-FAT SEPARATION USING REGULARISED SENSE RECONSTRUCTION

(71) Applicant: KONINKLIJKE PHILIPS N.V., Eindhoven (NL)

(72) Inventors: Elwin de Weerdt, Eindhoven (NL); Steven Koppelman, Eindhoven (NL); Johannes Martinus Peeters, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 378 days.

(21) Appl. No.: 14/895,006

(22) PCT Filed: Jun. 5, 2014

(86) PCT No.: PCT/EP2014/061644
§ 371 (c)(1),
(2) Date: Dec. 1, 2015

(87) PCT Pub. No.: WO2014/195384
PCT Pub. Date: Dec. 11, 2014

(65) Prior Publication Data
US 2016/0124064 A1 May 5, 2016

(30) Foreign Application Priority Data
Jun. 6, 2013 (EP) .................................... 13170826

(51) Int. Cl.
*G01R 33/56* (2006.01)
*G01R 33/24* (2006.01)
(Continued)

(52) U.S. Cl.
CPC ....... *G01R 33/5608* (2013.01); *G01R 33/243* (2013.01); *G01R 33/4828* (2013.01);
(Continued)

(58) Field of Classification Search
CPC .............. G01R 33/5608; G01R 33/243; G01R 33/4828; G01R 33/5607; G01R 33/5611; G01R 33/5616; G01R 33/56563
See application file for complete search history.

(56) References Cited

U.S. PATENT DOCUMENTS

2009/0292197 A1 11/2009 Fuderer
2011/0254547 A1* 10/2011 Reeder ............... G01R 33/4828
324/309

(Continued)

FOREIGN PATENT DOCUMENTS

WO 2009135167 A1 11/2009

OTHER PUBLICATIONS

Ma et al "Multipoint Dixon Imaging Using Sensitivity Encoding" Proc. Intl. Soc. Mag. Reson. Med 11 (2003) p. 1069.
(Continued)

*Primary Examiner* — Rodney Bonnette

(57) ABSTRACT

A method of MR imaging includes acquiring reference MR signal data from the object (10); deriving a $B_0$ map from the reference MR signal data; adapting sensitivity maps according to the $B_0$ map, which sensitivity maps indicate spatial sensitivity profiles of one or more RF receiving coils (11, 12, 13), to correct for geometric distortions of the sensitivity maps; acquiring imaging MR signal data from the object (10) via the one or more receiving coils (11, 12, 13) with sub-sampling of k-space; and reconstructing a MR image from the imaging MR signal data. Sub-sampling artifacts are eliminated using the adapted sensitivity maps. The reference MR signal data are acquired using a multi-point Dixon
(Continued)

technique. A water image and a fat image are reconstructed from the imaging MR signal data using separate water and fat sensitivity maps. The water and fat images are preferably reconstructed using regularized SENSE.

11 Claims, 3 Drawing Sheets

(51) Int. Cl.
G01R 33/48 (2006.01)
G01R 33/561 (2006.01)
G01R 33/565 (2006.01)

(52) U.S. Cl.
CPC ...... *G01R 33/5607* (2013.01); *G01R 33/5611* (2013.01); *G01R 33/5616* (2013.01); *G01R 33/56563* (2013.01)

(56) References Cited

U.S. PATENT DOCUMENTS

| 2011/0267054 A1* | 11/2011 | He | A61B 5/055 |
| | | | 324/309 |
| 2011/0268332 A1* | 11/2011 | Hofstetter | G01R 33/4804 |
| | | | 382/131 |
| 2016/0232663 A1* | 8/2016 | Nickel | G06T 11/003 |
| 2017/0299681 A1* | 10/2017 | Trzasko | G01V 3/00 |

OTHER PUBLICATIONS

McKenzie et al "Abdonminal Three Point Dixon Imaging With Self Calibrating Parallel MRI" Proc. Intl. Soc. Mag. Reson. Med 11 (2004) p. 917.

Liu et al "Regularized Sensitivity Encoding (SENSE) Reconstruction Using Bregman Iterations" Magnetic Resonance in Medicine, vol. 61, p. 145-152 (2009).
Larkman et al"Parallel Magnetic Resonance Imaging" Physics in Medicine and Biology, 52 (2007) p. 15-55.
Sodkckson et al Simultaneous Acquisition of Spatial Harmonics (SMASH) . . . , Magnetic Resonance in Medicine (1997) vol. 38, p. 591-603.
Tsao et al "Hierarchical Ideal: Fast, Robutst, and Multiresolution Spearation of Multiple Chemical Species From Multiple Echo Times" Magnetic Resonance in Medicine vol. 70, p. 155-159 (2013).
Trzasko et al, "Swirls 3D CE-MRA With Field Corrected Sparse Sense Reconstruction" Proceedings of the International Society for Magnetic Resonance in Medicine, 21st Annual Meeting and Exhibition, Salt Lake City, Utah, USA, Apr. 20-26, 2013.
Lin et al, Sensitivity Encoded (SENSE) Proton Echo-Planar Spectroscopic Imaging (PEPSI) in the Human Brain, Magnetic Resonance in Med. vol. 57, p. 249-257 (2007).
Sharma et al "Chemical shift encoded water-fat separation using parallel imaging and compressed sensing" Magnetic Resonance in Medicine vol. 69, p. 456-466 (2013).
Kellman et al "Multiecho dixon fat and water separation method for detecting fibrofatty infiltration in the myocardium" Magnetic Resonance in Med. vol. 61, p. 215-221 (2009).
Huang et al "A rapid and robust numerical algorithm for sensitivity encoding with sparsity constraints:self-feeding sparse SENSE" Magnetic Resonance in Medicine, vol. 64, p. 1078-1088 (2010).
Pruessmann et al, "SENSE: Sensitivity Encoding for Fast MRI" Magnetic Resonance in Medicine, vol. 42, p. 952-962, (1999).
Lin et al"Parallel imaging reconstruction using automatic regularization" Magnetic Resonance in Med. vol. 51, p. 559-567 (2004).
Uecker et al "Makine SENSE of Chemical Shift . . . " Proc. Soc. Mag. Reson. Med. vol. 20 p. 2490 (2012).

* cited by examiner

PARALLEL MRI WITH $B_0$ DISTORTION CORRECTION AND MULTI-ECHO DIXON WATER-FAT SEPARATION USING REGULARISED SENSE RECONSTRUCTION

CROSS REFERENCE TO RELATED APPLICATIONS

This application is a U.S. national phase application of International Application No. PCT/EP2014/061644, filed on Jun. 5, 2014, which claims the benefit of EP Application Serial No. 13170826.5 filed on Jun. 6, 2013 and is incorporated herein by reference.

FIELD OF THE INVENTION

The invention relates to the field of magnetic resonance (MR) imaging. It concerns a method of MR imaging of an object positioned in an examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field $B_0$ extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

Recently, techniques for accelerating MR acquisition have been developed which are called parallel acquisition. Methods in this category are SENSE (Pruessmann et al., "SENSE: Sensitivity Encoding for Fast MRI", Magnetic Resonance in Medicine 1999, 42 (5), 1952-1962) and SMASH (Sodickson et al., "Simultaneous acquisition of spatial harmonics (SMASH): Fast imaging with radiofrequency coil arrays", Magnetic Resonance in Medicine 1997, 38, 591-603). SENSE and SMASH use sub-sampled k-space data acquisition obtained from multiple RF receiving coils in parallel. In these methods, the (complex) signal data from the multiple coils are combined with complex weightings in such a way as to suppress sub-sampling artefacts (aliasing) in the finally reconstructed MR images. This type of complex array combining is sometimes referred to as spatial filtering, and includes combining which is performed in the k-space domain (as in SMASH) or in the image domain (as in SENSE), as well as methods which are hybrids. In either SENSE or SMASH, it is essential to know the proper weightings or spatial sensitivities of the receiving coils with sufficient accuracy. To obtain the coil sensitivities, i.e. the spatial sensitivity profiles of the receiving coils used for signal detection, a calibration pre-scan is typically performed prior to and/or after the actual image acquisition. In the pre-scan, the MR signals are usually acquired at a resolution which is significantly lower than the resolution required for the diagnostic MR image. The low-resolution pre-scan typically consists of an interleaving of signal acquisition via the array of receiving coils and via a volume coil, for example the quadrature body coil of the MR apparatus. Low resolution MR images are reconstructed from the MR signals received via the array receiving coils and via the volume RF coil. Sensitivity maps indicating the spatial sensitivity profiles of the receiving coils can then be computed, for example, by division of the receiving coil images by the volume coil image.

With increasing field strength, the off-resonance effects caused by $B_0$ inhomogeneities become more severe and affect almost all MR applications.

Echo planar imaging (EPI) is particularly susceptible to $B_0$ field inhomogeneity leading to geometry distortions in the acquired data. These distortions cause discrepancies between the sensitivity maps acquired in the pre-scan and the 'true' spatial sensitivity distributions of the receiving coils. In typical SENSE implementations no distinction is made between reconstructions from MR signal data acquired by EPI scans and non-EPI scans. In EPI scans the water-fat shift is considerably larger than in non-EPI scans. Due to the large water-fat shift, image quality is considerably compromised with conventional SENSE reconstruction. MR signals emanating from fatty tissue are shifted in the direction of the water-fat shift (i.e. parallel to the phase-encoding direction). This shift causes different types of artefacts: One type of artefacts results from MR signals of fat shifting inwards into the inside of the examined anatomy. Another type of artefacts results from MR signals of fat shifting outwardly from the examined anatomy but folding back (due to the sub-sampling and due to the sensitivity maps containing no information outside of the examined anatomy) into the inside of the anatomy. In either case, sub-sampling artefacts are only incompletely eliminated by the SENSE reconstruction. The corresponding artefacts are often encountered in practice when EPI scans are combined with parallel acquisition schemes. A further type of artefact is caused by the geometric deformation of the measured anatomy during the acquisition of the imaging MR signal data due to the main magnetic field inhomogeneity. This deformation is different from that experienced during the reference scan. As a consequence, the sensitivity maps are not properly aligned for the reconstruction of the MR image. This results in incomplete elimination of sub-sampling artefacts.

From the foregoing it is readily appreciated that there is a need for an improved MR imaging technique. It is consequently an object of the invention to provide a method that enables parallel imaging with increased image quality, notably by achieving a better suppression of sub-sampling artefacts.

SUMMARY OF THE INVENTION

In accordance with the invention, a method of MR imaging of an object positioned in an examination volume of a MR device is disclosed. The method comprises the steps of:
  acquiring reference MR signal data from the object;
  deriving a $B_0$ map from the reference MR signal data;
  adapting sensitivity maps according to the $B_0$ map, which sensitivity maps indicate spatial sensitivity profiles of one or more RF receiving coils, to correct for geometric distortions of the sensitivity maps;
  acquiring imaging MR signal data from the object via the one or more receiving coils with sub-sampling of k-space; and
  reconstructing a MR image from the imaging MR signal data, wherein sub-sampling artefacts are eliminated using the adapted sensitivity maps.

According to the invention, the sensitivity maps and/or the imaging MR signal data may be acquired using EPI. Alternatively, a three-dimensional field echo (FFE) sequence may be employed for acquisition of the sensitivity maps. An adaptation to correct for geometry distortions owing to $B_0$ inhomogeneities is applied to the sensitivity maps. Optionally, a corresponding correction may be applied to the acquired imaging MR signal data as well. After the correction, the sensitivity maps accurately represent the 'true' sensitivities of the used receiving coils at the respective locations of the patient's anatomy. The invention thereby enables to reduce residual sub-sampling artefacts after SENSE reconstruction.

Preferably, the imaging MR signal data are acquired in parallel via two or more RF receiving coils having different spatial sensitivity profiles. It has to be noted, however, that the scope of the invention is not restricted to parallel imaging. The imaging MR signal data acquisition may be performed using only a single RF receiving coil, wherein the MR image is reconstructed from the sub-sampled imaging MR signal data, for example, by using the known Compressed Sensing (CS) technique.

In a preferred embodiment of the invention, the reference MR signal data are acquired using a multi-point Dixon technique.

According to the per se known multi-point Dixon technique, the spectral difference between fat and water protons (also referred to as water-fat shift) is made use of for the purpose of separating MR signals emanating from water containing tissue and MR signals emanating from fat tissue. In multi-point Dixon, multiple acquisitions of k-space are repeated with different echo times. The simplest Dixon technique, 2-point Dixon, acquires two complete k-space data sets, wherein the fat magnetization in the second acquisition is out of phase relative to the first acquisition at the respective echo times. Separate and distinct water and fat images are obtained by simple addition or a subtraction of the complex MR signal data sets. In general, a $B_0$ map, a water map and a fat map are obtained by means of a multi-point Dixon technique.

According to the invention, a multi-point Dixon sequence may be applied during acquisition of the reference MR signal data prior to the acquisition of the actual imaging MR signal data. The advantage is that $B_0$ mapping using multi-point Dixon is very fast and provides useful information regarding the water and fat distribution within the field of view in addition to the $B_0$ map. The $B_0$ map is exploited according to the invention for adapting the sensitivity maps.

Preferably, the reference MR signal data are acquired at an image resolution that is lower than the image resolution of the imaging MR signal data. Because of the reduced image resolution, the reference MR signal data can be acquired much faster than the imaging MR signal data. The resolution of the reference MR signal data acquisition may be smaller than the resolution of the imaging MR signal data acquisition by a factor of at least 2 to 10.

According to a preferred embodiment of the invention, signal contributions from water and fat protons to the imaging MR signal data are separated in the step of reconstructing the MR image, whereby a water image and a fat image are obtained. In other words, the invention enables the simultaneous reconstruction of a water image and a fat image by means of SENSE reconstruction from the acquired imaging MR signal data. Preferably, the water image is reconstructed using a water sensitivity map, and the fat image is reconstructed using a fat sensitivity map that is different from the water sensitivity map. This takes the fat-shift into account. Each of the separate (adapted) water and fat sensitivity maps accurately represent the sensitivities of the used receiving coils at the locations of water and fat tissue respectively. The fat sensitivity map may be computed from the water sensitivity map by a simple translation in the direction of the fat shift.

According to yet another preferred embodiment of the invention, a so-called "fat fraction" is computed from the Dixon water and fat maps for each voxel, which fat fraction indicates the relation of the signal contributions of water and fat protons at the respective image position. The fat fraction can be defined as the quotient: fat signal/(fat signal+water signal). The fat fraction thus reflects the relative signal contribution from fat protons to the total signal at the respective voxel position. The fat fraction can then be used in the step of reconstructing the MR image in order to relate the signal contributions from water and fat to each other. Since the number of unknowns in the reconstruction is significantly reduced in this way, the conditioning of the inverse problem and, consequently, the quality of the resulting MR image can be improved.

In a further preferred embodiment of the invention, regularisation (as, for example, regularised SENSE) is used for reconstructing the MR image. The application of regularisation is per se known in the art. It is particularly advantageous in cases in which the inverse problem of MR image reconstruction is ill-conditioned, for example due the geometry of the sensitivity maps and/or the applied k-space sampling scheme. By using regularisation, the solution of the reconstruction problem is biased towards some prior information. This prior information may, for example, be one or more low-resolution MR images of the examined anatomy, which are referred to as regularisation maps. Regularisation improves the conditioning of the inverse problem of MR image reconstruction. Preferably, the regularisation maps are adapted according to the $B_0$ map as well in order to correct for geometric distortions.

According to yet another preferred embodiment of the invention, regularisation is used for simultaneous reconstruction of a water image and a fat image from the acquired imaging MR signal data. It is in principle possible to use one regularisation map for reconstructing both the water and the fat image. However, it turns out that image quality can be significantly improved if suitably selected separate regularisation maps are used for reconstructing the water and fat images. This means that independent regularisations are applied for reconstructing the water and fat images respectively. If, for example, the reference MR signal data are acquired using multi-point Dixon, as described above, the obtained (low-resolution) water map can advantageously be used as a water regularisation map while the fat map can be used as a fat regularisation map. The water and fat maps obtained with the multi-point Dixon method provide valuable information regarding the locations of water and fat tissue within the examined anatomy. This information is exploited according to the invention to improve the conditioning of the reconstruction problem and the image quality. It should be noted in this context that the multi-point Dixon technique provides the water and fat maps without additional acquisition time.

In a further preferred embodiment of the method of the invention, fat suppression may be employed in the step of acquiring the imaging MR signal. Fat suppression is the process of utilizing specific parameters of the used imaging sequence to remove, to the largest possible extent, the effects of signal contributions from fat protons to the resulting MR image. For example, frequency-selective RF excitation pulses may be applied, which produce saturation of the magnetization of fat protons. The conditioning of the SENSE reconstruction can be further improved by employing fat suppression. Any signal contribution from fat protons which is not (fully) suppressed can be removed by the method of the invention, thus leading to a very robust fat suppressed SENSE reconstruction scheme.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume, one or more receiving coils for receiving MR signals from an object positioned in the examination volume, a control unit for controlling the temporal succession of RF pulses and switched magnetic field gradients, and a reconstruction unit. The method of the invention is implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
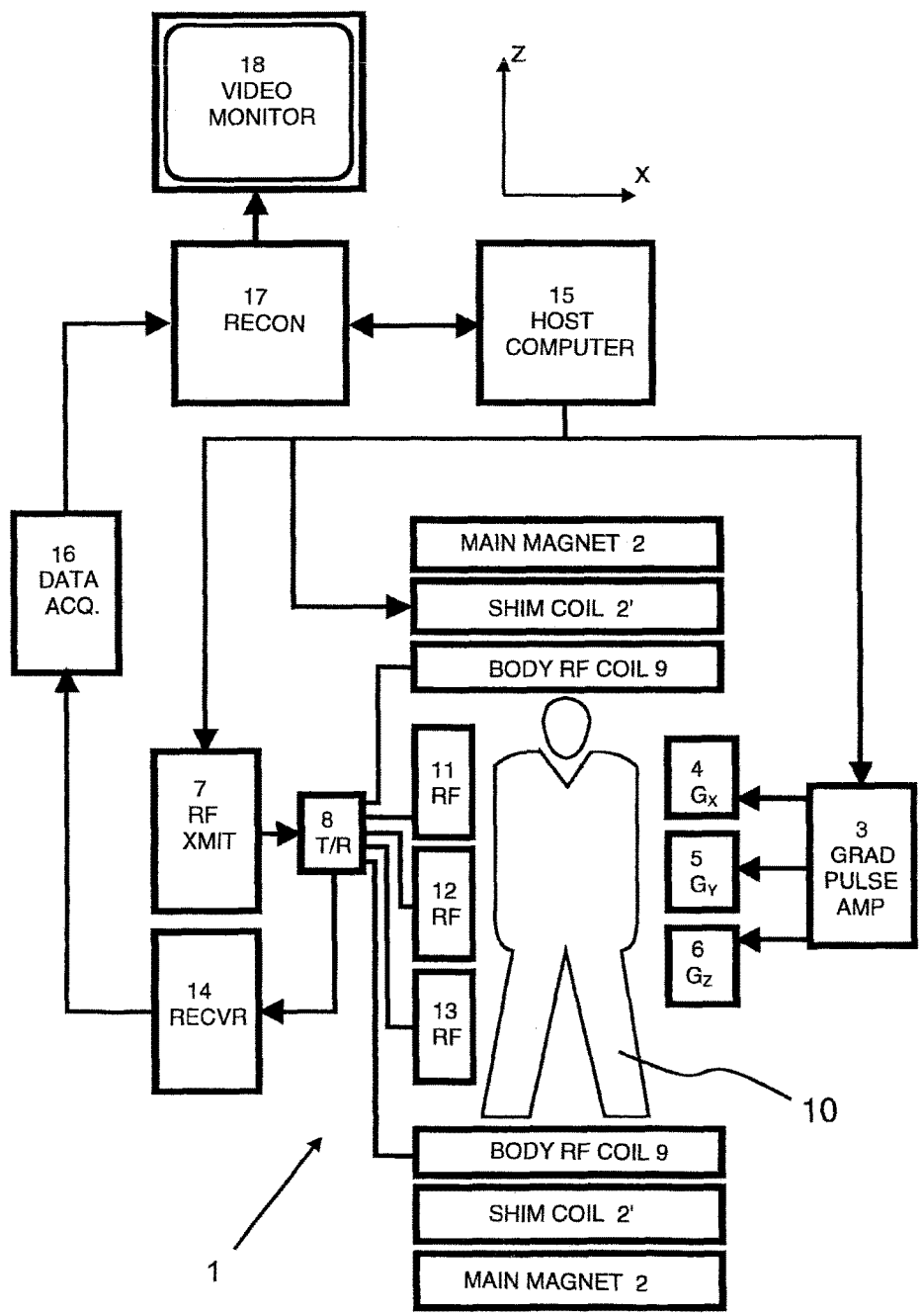
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used as receiving coils to receive MR signals induced by body-coil RF transmissions.

The resultant MR signals are picked up by the body RF coil 9 and/or by the array RF coils 11, 12, 13 and demodulated by a receiver 14 preferably including a pre-amplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI). For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices, the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

A practical embodiment of the method of the invention is described as follows:

After positioning the body 10 in the iso-centre of the main magnet coil 2, a pre-scan is started for acquiring reference MR signal data. The pre-scan uses interleaving signal acquisition via the body RF coil 9 and the array RF coils 11, 12, 13. Sensitivity maps indicating the spatial sensitivity profiles of the array RF coils 11, 12, 13 are derived from the reference MR signal data as well as a $B_0$ map, a water map, and a fat map. A multi-point Dixon technique is employed for this purpose. The reference MR signal data are acquired at low resolution, i.e. from a limited central portion of k-space. The whole pre-scan can thus be performed within a couple of seconds.

After the pre-scan, an EPI imaging scan is performed at a higher image resolution, i.e. an image resolution that is sufficient for the respective diagnostic imaging task. Imaging MR signal data are acquired from the body 10 via the array RF coils 11, 12, 13 in parallel with sub-sampling of k-space. Finally, SENSE reconstruction is applied to the acquired imaging MR signal data. Therein, sub-sampling artefacts (aliasing) are suppressed using the sensitivity maps obtained from the pre-scan.

According to the invention, the sensitivity maps are adapted prior to the SENSE image reconstruction step in order to reduce residual aliasing artefacts. To this end, a deformation map is computed. The deformation map indicates, for each image position, how much the examined anatomy is deformed in the acquired imaging MR signal date due to $B_0$ inhomogeneity as a function of the water-fat shift. The deformation map is formed using the $B_0$ map obtained from the pre-scan. An example of a $B_0$ map used in brain imaging is shown in the left image of FIG. 2. The relation for each location between the $B_0$ offset and the deformation in units of pixels is given by:

$$\Delta y = \Delta B_0 \text{ [Hz]} \cdot \text{WFS [pixels/Hz]}$$

Figure 2:
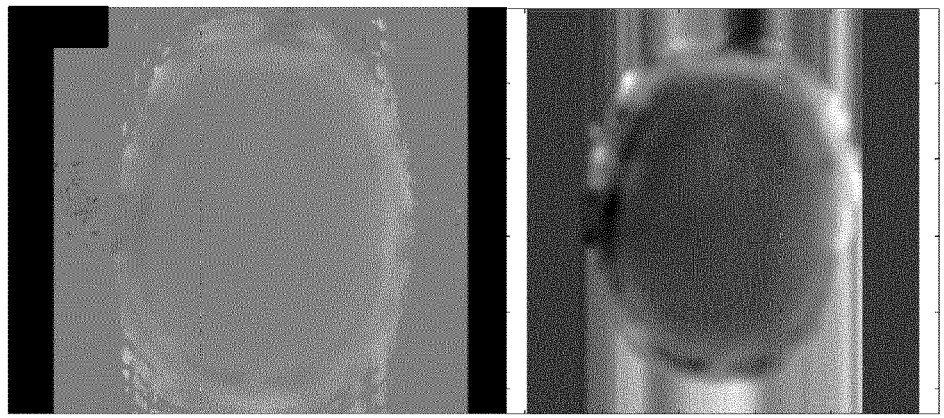
FIG. 2 shows a $B_0$ map acquired according to the invention and a deformation map derived from the $B_0$ map.

The deformation map resulting from the $B_0$ map shown in the left image of FIG. 2 is shown in the right image of FIG. 2. The grey value is a measure of deformation in the direction of the water-fat shift (WFS).

On the basis of the deformation map, the sensitivity maps (CSM=coil sensitivity map) obtained from the pre-scan are adapted by computing a deformed sensitivity map for each receiving coil 11, 12, 13. This is done by using any interpolation scheme, e.g. a simple linear interpolation:

$$\text{CSM}_{def}(x, y+\Delta y) = \text{interp}(x, y, \text{CSM}_{orig}, x, y+\Delta y)$$

Therein, $\text{CSM}_{def}$ represents a deformed sensitivity map while $\text{CSM}_{orig}$ represents a corresponding 'original' sensitivity map resulting from the pre-scan. x and y are the image positions, and $\Delta y$ represents the deformation at the respective position (see above).

Figure 3:
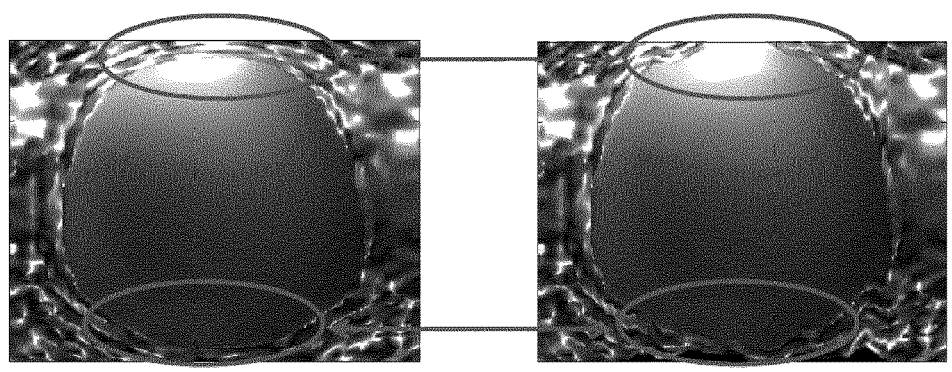
FIG. 3 illustrates the adaptation of sensitivity maps according to the invention.

The left image in FIG. 3 shows an example of an originally acquired sensitivity map $\text{CSM}_{orig}$ of a single receiving coil. The right image in FIG. 3 shows the corresponding deformed sensitivity map $\text{CSM}_{def}$. The grey value at each image position indicates the sensitivity of the receiving coil which is placed over the patient's forehead in the depicted embodiment. The encircled areas in FIG. 3 indicate regions of large deformations caused by $B_0$ inhomogeneity.

As a next step, deformed sensitivity maps are computed for the shifted fat signals. This is achieved by a translation of the already deformed sensitivity maps for water $\text{CSM}_{water} = \text{CSM}_{def}$ in the direction of the water-fat shift and by the amount of the water-fat shift WFS:

$$\text{CSM}_{fat}(x,y) = \text{CSM}_{water}(x, y+\text{WFS})$$

$\text{CSM}_{fat}$ represents a deformed sensitivity map for the fat signals for a given receiving coil.

As a next step, imaging MR signal data m are acquired from the body 10 of the patient in parallel via the receiving coils 11, 12, 13 using an EPI sequence with sub-sampling of k-space.

Thereafter, a water image and a fat image are reconstructed simultaneously from the acquired MR signal data m by solving a set of linear equations as follows:

$$\begin{bmatrix} \text{CSM}_{water} & \text{CSM}_{fat} \\ R_{water}^{-1/2} & 0 \\ 0 & R_{water}^{-1/2} \end{bmatrix} \begin{bmatrix} p_{water} \\ p_{fat} \end{bmatrix} = \begin{bmatrix} m \\ 0 \\ 0 \end{bmatrix}$$

Therein, m represents the vector of imaging MR signal data for all used receiving coils, $p_{water}$ and $p_{fat}$ are the vectors of the image values of the water image and the fat image respectively. $\text{CSM}_{water}$ and $\text{CSM}_{fat}$ are matrix representations of the deformed sensitivity maps for water and fat for all used receiving coils. A regularised SENSE reconstruction scheme is applied. $R_{water}$ the corresponding (diagonal) regularisation matrix.

It should be noted that the simultaneous reconstruction of water and fat images increases the applied SENSE factor (indicating the amount of sub-sampling) by a factor of two. The effective SENSE factor per location is reduced by a proper definition of the regularisation terms, i.e. if the regularisation term for fat resembles a situation in which there is no fat signal at a given location, then the effective SENSE factor returns to its original value. The conditioning of the reconstruction problem is in this case close to the original case (i.e. without simultaneous reconstruction of a fat image).

It turns out that an optimal definition of the regularisation for water and fat is of importance for the technique of the invention.

In the above equation, the original 'water' regularization map $R_{water}$ is used for both the water and the fat images (initially water and fat contributions cannot be distinguished). Although this is a valid choice, the conditioning of the reconstruction problem will be reduced with respect to the original (water only) reconstruction. Residual sub-sampling artefacts due to $B_0$ inhomogeneity will be eliminated. However, a significant drop in signal-to-noise (SNR) may be observed. To improve the conditioning, the invention proposes is to use water and fat maps obtained from the multi-point Dixon pre-scan as regularisation maps for the reconstruction of the water and fat images respectively.

$$\begin{bmatrix} CSM_{water} & CSM_{fat} \\ R_{water}^{-1/2} & 0 \\ 0 & R_{fat}^{-1/2} \end{bmatrix} \begin{bmatrix} p_{water} \\ p_{fat} \end{bmatrix} = \begin{bmatrix} m \\ 0 \\ 0 \end{bmatrix},$$

wherein $R_{fat}$ is the corresponding (diagonal) regularisation matrix for fat.

Figure 4:
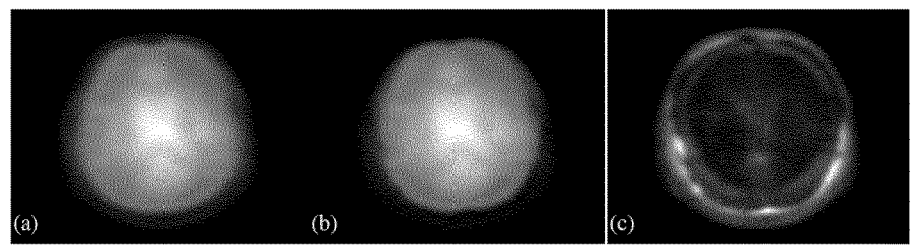
FIG. 4 shows regularisation maps for regularised SENSE reconstruction according to the invention.
Figure 5:
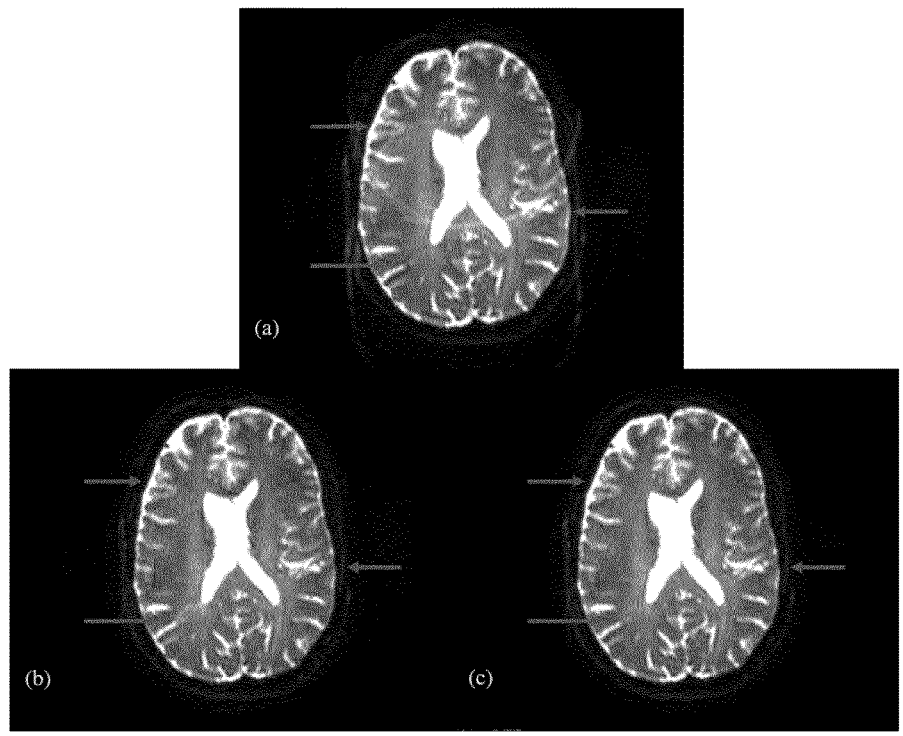
FIG. 5 shows in vivo MR brain images acquired and reconstruction with the conventional SENSE approach (a), with adapted coil sensitivity maps (b), and with multi-point Dixon water and fat maps as regularization maps.

These maps provide much more valuable information regarding the location of water and fat signal. The water and fat maps are obtained simultaneously along with the $B_0$ map. Hence, no extra acquisition time or reconstruction time is required. FIG. 4a shows a regularisation map resulting from a conventional SENSE pre-scan. FIG. 4b shows a regularisation map obtained from the multi-point Dixon water map, while FIG. 4c shows a regularisation map obtained from the multi-point Dixon fat map. Using the multi-point Dixon maps enhances conditioning significantly. The SNR in the reconstructed water and fat images is significantly reduced. This can clearly be seen in the in-vivo MR images shown in FIG. 5. FIG. 5a shows a head image obtained from a conventional SENSE pre-scan in combination with a conventional SENSE acquisition and reconstruction scheme. Significant sub-sampling artefacts are observed. FIG. 5b shows the same image with a pre-scan according to the invention and with corresponding $B_0$ correction of the sensitivity maps. A standard regularisation map is applied in FIG. 5b. The sub-sampling artefacts are considerably reduced in comparison to FIG. 5a. In FIG. 5c water and fat maps obtain from the multi-point Dixon pre-scan are used as regularisation maps. The sub-sampling artefact reduction is stronger in FIG. 5c. Moreover, SNR is increased and image background is much cleaner than in FIG. 5b.

Optionally, the so-called "fat fraction" (FF) can be used in the method of the invention to relate the signal contributions from water protons and fat protons to each other such that the conditioning of the reconstruction problem is further enhanced. The fat fraction FF at position y can be computed from the multi-point Dixon maps $p_{water}(y)$ and $p_{fat}(y)$ as follows:

$$FF(y) = \frac{|p_{fat}(y)|}{|p_{fat}(y)| + |p_{water}(y)|} \rightarrow |p_{fat}(y)| = \frac{FF(y)}{1 - FF(y)} |p_{water}(y)|$$

To incorporate this relation into the SENSE reconstruction scheme for reconstructing the final MR image from the imaging MR signal data of the EPI scan, it has to be taken into account that the fat signal is shifted due to the water-fat shift. Hence, the relation between the fat and water maps has to be modified into:

$$|p_{fat}(\bar{x}_u + WFS)| = \frac{FF(\bar{x}_u)}{1 - FF(\bar{x}_u)} |p_{water}(\bar{x}_u)|,$$

wherein $\bar{x}_u$ represents the voxel position in the MR image to be reconstructed. In the ideal case, this relation can directly be used to reduce the number of unknowns in the reconstruction problem to that of the original system (i.e. without water/fat separation).

In a practical implementation, several aspects need to be considered: The resolution of the Dixon water and fat maps may be lower than that of the EPI acquisition. Patient motion may have taken place between the Dixon pre-scan and the EPI scan. The Dixon pre-scan scan may have a different water/fat signal weighting as compared to that of the EPI scan. If fat suppression is applied, the Dixon pre-scan should employ the same fat suppression which is applied to the EPI scan.

In order to make the technique of the invention robust with respect to motion and in order to achieve a fast Dixon pre-scan, the resolution of the Dixon pre-scan may be kept low. This means that the fat fraction obtain on the basis of the above formula is a rough estimate of the relation between water and fat signal contributions rather than an accurate representation of the true relation.

In order to employ the fat fraction derived from the Dixon maps in the reconstruction of the MR image from the imaging MR signal data acquired by the EPI imaging scan, sequence modelling may be applied:

If, for example, the Dixon pre-scan is a RF spoiled field echo sequence, the following steady state signal model may be used (the fat map $p_{f,DIX}(x,y)$ is taken as an example):

$$|p_{f,DIX}(x, y)| = \rho_f \frac{\left(1 - e^{\left\{-\frac{T_{R,DIX}}{T_{1,f}}\right\}}\right)}{1 - \cos\alpha_{DIX} e^{\left\{-\frac{T_{R,DIX}}{T_{1,f}}\right\}}} M_z^-(0) \sin\alpha_{DIX}$$

Therein, $\rho_f$ indicates the fat density, $T_{R,DIX}$ is the repetition time of the sequence, $T_{1,f}$ is the longitudinal relaxation time of fat protons, $M_z^-(0)$ is the longitudinal steady state magnetization, and $\alpha_{DIX}$ is the flip angle of the RF excitation.

If the EPI scan used for acquiring the imaging MR signal data is a spin echo sequence (with long repetition time $T_R$) the following model can be used (the fat image $p_{f,EPI}(x,y)$ is taken as an example):

$$|p_{f,EPI}(x, y)| = \rho_f M_z^-(0) e^{\left\{-\frac{T_{E,EPI}}{T_{2,f}}\right\}} \sin\alpha_{EPI}$$

Therein, $T_{E,EPI}$ represents the echo time of the EPI scan, $T_{2,f}$ is the transversal relaxation time of the fat protons, and $\alpha_{EPI}$ is the flip angle of the RF excitation of the EPI scan.

With these models it is possible to derive the voxel-wise relation between the fat and water signal contributions from the imaging MR signal data of the EPI scan from the water and fat maps obtained via the Dixon pre-scan. The use of this relation considerably improves the conditioning of the SENSE reconstruction and thus results in a significant increase in image quality.

It has to be noted that the above-described approach of the invention can be used in combination with fat suppression. The conditioning of the SENSE reconstruction is improved even further in this case. Any signal contribution from fat protons which is not (fully) suppressed can be removed using the proposed technique, thus leading to a very robust fat suppressed SENSE reconstruction.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of magnet resonance (MR) imaging of an object positioned in an examination volume of a MR device, the method comprising the steps of:
   acquiring reference MR signal data from the object using a multi-point Dixon technique and by way of two or more RF receiving coils having sensitivity maps that indicate their spatial sensitivity profiles;
   deriving a $B_0$ map from the reference MR signal data;
   deriving a multi-point Dixon water map and a multi-point Dixon fat map from the reference MR signal data;
   correcting the sensitivity maps according to the $B_0$ map for geometric distortions of the sensitivity maps;
   acquiring imaging MR signal data from the object via the one or more receiving coils with sub-sampling of k-space;
   reconstructing a MR image from the imaging MR signal data, wherein sub-sampling artefacts are eliminated using the corrected sensitivity maps, wherein
   the correction of the sensitivity maps includes computation of separate corrected sensitivity maps associated with signals from water and from fat, respectively and
   the reconstruction of the MR image is performed by way of a regularised SENSE reconstruction scheme which employs the corrected sensitivity maps to simultaneously unfold a separate water image and a fat image and
   the regularisation employs as a regularisation map the multi-point Dixon water map and the multi-point Dixon fat map derived from the reference MR signal data.

2. The method of claim 1, wherein the reference MR signal data are acquired at an image resolution that is lower than the image resolution of the imaging MR signal data.

3. The method of claim 1, wherein the reference MR signal data and/or the imaging MR signal data are acquired by using echo planar imaging.

4. The method of claim 1, wherein a fat fraction is computed from the water map and the fat map, which fat fraction indicates the relation of the signal contributions of water and fat protons at each image position, wherein the fat fraction is used in the step of reconstructing the MR image.

5. The method of claim 4, wherein the water image is reconstructed using a water sensitivity map, and the fat image is reconstructed using a fat sensitivity map that is different from the water sensitivity map.

6. The method of claim 5, wherein the fat sensitivity map is computed from the water sensitivity map by a translation in the direction of a fat shift.

7. The method of claim 1, wherein the water image is reconstructed using a water regularisation map, and the fat image is reconstructed by using a fat regularisation map.

8. The method of claim 1, wherein the water regularisation map is derived from the water map, and fat regularisation map is derived from the fat map.

9. A MR device for carrying out the method claimed in claim 1, wherein the MR device includes at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume, one or more receiving coils for receiving MR signals from an object positioned in the examination volume, a control unit for controlling the temporal succession of RF pulses and switched magnetic field gradients, and a reconstruction unit, wherein the MR device is arranged to perform the following steps:
   acquiring reference MR signal data from the object using a multi-point Dixon technique by way of two or more RF receiving coils having sensitivity maps that indicate their spatial sensitivity profiles;
   deriving a $B_0$ map from the reference MR signal data;
   deriving a multi-point Dixon water map and a multi-point Dixon fat map from the reference MR signal data;
   correcting sensitivity maps according to the $B_0$ map, for geometric distortions of the sensitivity maps;
   acquiring imaging MR signal data from the object via the one or more receiving coils with sub-sampling of k-space;
   reconstructing a MR image from the imaging MR signal data, wherein sub-sampling artefacts are eliminated using the adapted sensitivity maps,
   wherein the correction of the sensitivity maps includes computation of separate corrected sensitivity maps associated with signals from water and from fat, respectively and
   wherein the reconstruction of the MR image is performed by way of a regularised SENSE reconstruction scheme which employs the corrected sensitivity maps to simultaneously unfold a separate water image and a fat image and
   wherein the regularisation employs as a regularisation map the multi-point Dixon water map and the multi-point Dixon fat map derived from the reference MR signal data.

10. A non-transitory computer-readable medium embodying a computer program computer program to be run on a MR device, which computer program comprises instructions for:
   acquiring reference MR signal data from an object using a multi-point Dixon technique and by way of two or more RF receiving coils having sensitivity maps that indicate their spatial sensitivity profiles;
   deriving a $B_0$ map from the reference MR signal data;
   deriving a multi-point Dixon water map and a multi-point Dixon fat map from the reference MR signal data;
   correcting the sensitivity maps according to the $B_0$ map, for geometric distortions of the sensitivity maps;
   acquiring imaging MR signal data from the object via the one or more receiving coils with sub-sampling of k-space;
   reconstructing a MR image from the imaging MR signal data, wherein sub-sampling artefacts are eliminated using the corrected sensitivity maps wherein the correction of the sensitivity maps includes computation of separate corrected sensitivity maps associated with signals from water and from fat, respectively and wherein the reconstruction of the MR image is performed by way of a regularised SENSE reconstruction scheme which employs the corrected sensitivity maps to simultaneously unfold a separate water image and a fat image and wherein the regularisation employs as a regularisation map the multi-point Dixon water map and the multi-point Dixon fat map derived from the reference MR signal data.

11. A MR device comprising:

at least one main magnet coil configured to generate a steady magnetic field $B_0$ within an examination volume;

a plurality of gradient coils configured to generate switched magnetic field gradients in different spatial directions within the examination volume;

at least one RF coil configured to generate RF pulses within the examination volume and receive MR signals from an object positioned in the examination volume;

one or more processors configured to:

control the gradient coils and the at least one RF coil to generate reference MR signal data from the object using a multi-point Dixon technique;

control the at least one RF coil to receive the reference MR signal data, the at least one RF receiving coil having at least one sensitivity map that indicates a spatial sensitivity profile;

derive a $B_0$ map from the reference MR signal data;

derive a multi-point Dixon water map and a multi-point Dixon fat map from the reference MR signal data;

compute separate sensitivity maps associated with signals from water and from fat;

correct the sensitivity maps based on the $B_0$ map, for geometric distortions of the sensitivity maps;

receive imaging MR signal data from the object from the at least one RF coil with sub-sampling of k-space; and reconstruct an MR image from the imaging MR data using a regularized SENSE reconstruction scheme which employs the multi-point Dixon water map and the multi-point Dixon fat map and eliminating sub-sampling artifacts.

* * * * *